(12) United States Patent
Gergintschew

(10) Patent No.: US 6,828,814 B2
(45) Date of Patent: Dec. 7, 2004

(54) CIRCUIT CONFIGURATION AND DISPLAY ELEMENT

(75) Inventor: Zenko Gergintschew, München (DE)

(73) Assignee: Infineon Technologies AG, Munich (DE)

(*) Notice: Subject to any disclaimer, the term of this patent is extended or adjusted under 35 U.S.C. 154(b) by 35 days.

(21) Appl. No.: 09/928,010

(22) Filed: Aug. 10, 2001

(65) Prior Publication Data

US 2003/0030463 A1 Feb. 13, 2003

(30) Foreign Application Priority Data

Aug. 10, 2000 (DE) .......................... 100 38 969

(51) Int. Cl.$^7$ .................. G01R 31/28; G01R 19/00

(52) U.S. Cl. ............... 324/765; 324/122; 324/133; 324/769

(58) Field of Search ................ 324/122, 133, 324/556, 765, 769; 340/815.45

(56) References Cited

U.S. PATENT DOCUMENTS

| | | | | |
|---|---|---|---|---|
| 4,857,826 A | * | 8/1989 | Graham | 324/508 |
| 4,945,760 A | * | 8/1990 | Hornung | 73/118.1 |
| 5,066,929 A | * | 11/1991 | Frantz | 331/57 |
| 5,270,638 A | * | 12/1993 | Mellott | 324/133 |
| 6,075,448 A | * | 6/2000 | Verkhovskiy | 340/657 |
| 6,313,751 B1 | * | 11/2001 | Whitmire et al. | 340/636 |

* cited by examiner

*Primary Examiner*—Ernest Karlsen
(74) *Attorney, Agent, or Firm*—Laurence A. Greenberg; Werner H. Stemer; Ralph E. Locher

(57) ABSTRACT

A circuit configuration has an integrated semiconductor element, preferably, an intelligent power semiconductor, and a display element. A display element diagnoses and displays disturbances in the integrated semiconductor element. The display element connects electrically firstly to the diagnostic output of the semiconductor element and secondly to the load output of the power stage, and contains light-emitting semiconductor diodes. The light-emitting diodes are connected in antiparallel and output to their environment visual information items and can be distinguished in accordance with the current fed to them.

13 Claims, 3 Drawing Sheets

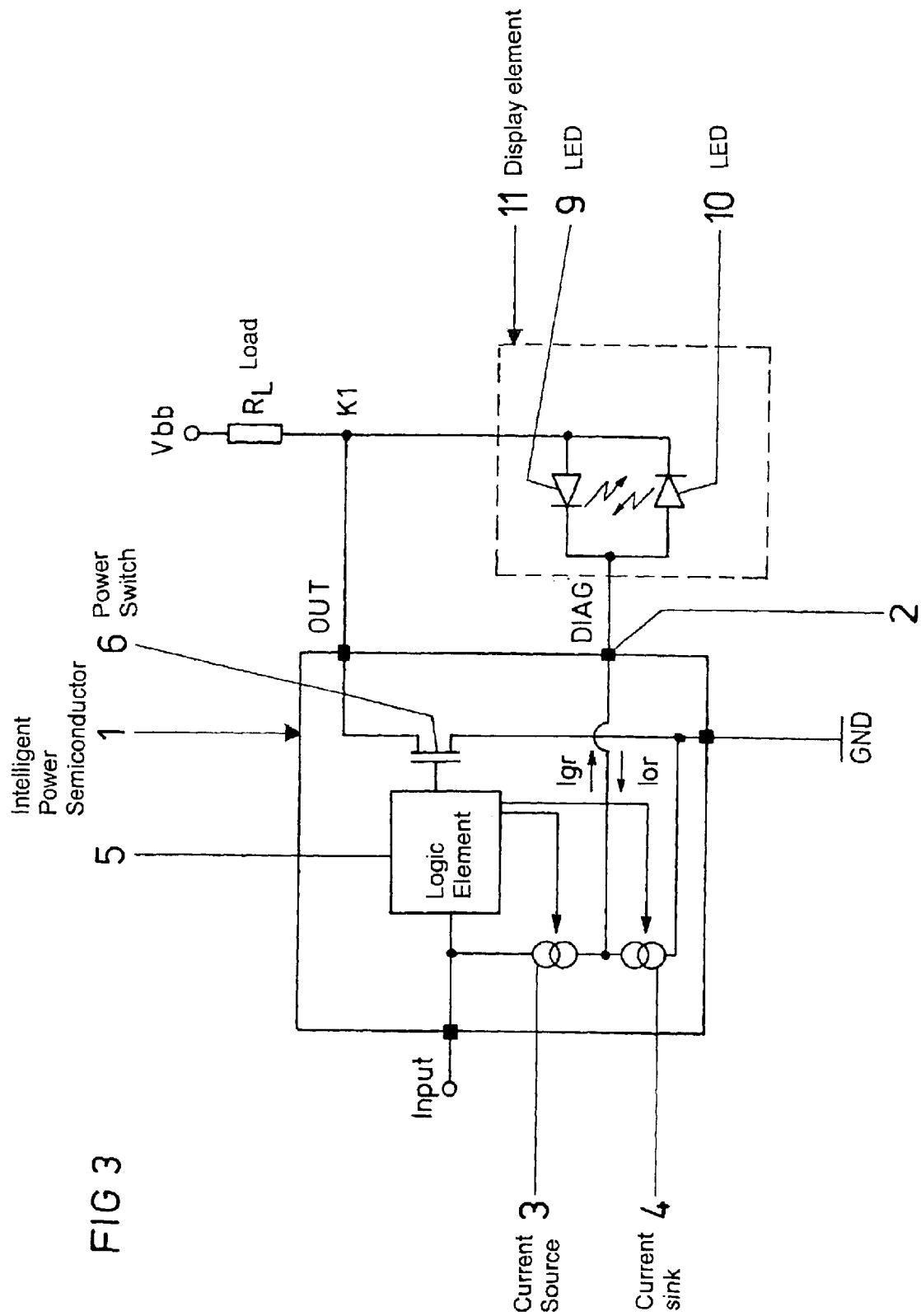

CIRCUIT CONFIGURATION AND DISPLAY ELEMENT

BACKGROUND OF THE INVENTION

FIELD OF THE INVENTION

The invention relates to a circuit configuration having an integrated semiconductor element and a display element. The invention also relates to an integrated display element for diagnosing and displaying a disturbance in a semiconductor element.

Semiconductor-based circuit breakers such as, for example, intelligent power semiconductors ("Smart Power Switches") that are used to drive a load can be equipped with display elements for displaying the circuit state, for example "ON" or "OFF". A generally known example of such a circuit configuration for displaying the circuit state is illustrated in FIG. 1. In the generally known illustrated circuit configuration for displaying an item of diagnostic information, a light-emitting diode (LED) which shines in a green color and has a series resistor in parallel with the load, is disposed at the output of the power stage.

Furthermore, intelligent power semiconductors such as those sold under the trademark PROFET® by Infineon Technologies AG, are known; these intelligent power semiconductors have diagnostic outputs for outputting diagnostic functions. Items of information to be output can be, for example, the occurrence of a short circuit, of overtemperature of the power stage, of a load disconnection, or of something similar.

It is disadvantageous in the known intelligent power semiconductors with diagnostic outputs to require a comparatively high number of electronic components to display the information to be diagnosed because these electronic components must be connected to the intelligent semiconductor element.

SUMMARY OF THE INVENTION

It is accordingly an object of the invention to provide a circuit configuration and display element that overcomes the hereinafore-mentioned disadvantages of the heretofore-known devices of this general type and that reduces the circuitry required to display the diagnostic function in semiconductor elements.

With the foregoing and other objects in view, there is provided, in accordance with the invention, a circuit configuration. The circuit configuration includes an intelligent power semiconductor having a single diagnostic output, a load output, a logic element, and a power switch. The power switch switches a load, a current source, and a current sink. The load connects to the load output, and the current source, and the current sink connect to a single diagnostic output and provide a current at the diagnostic output. The logic element can control the power switch and/or the current source and the current sink. The circuit configuration also includes a display element having light-emitting semiconductor diodes, a first terminal, and a second terminal. The first terminal electrically connects to the single diagnostic output of the semiconductor element. The second terminal electrically connected to the load output of the power switch. The light-emitting semiconductor diodes connects in antiparallel between the first terminal and the second terminal and outputs different visual information items when receiving different currents.

With the objects of the invention in view, there is also provided a display element for diagnosing and displaying a disturbance in an intelligent power semiconductor. The display element includes an input terminal for connecting to an intelligent power semiconductor. The display element also includes a supply terminal for receiving a supply potential. The display element includes light-emitting semiconductor diodes connected in antiparallel between the input terminal and the supply terminal. The light-emitting semiconductor diodes output differing light signals as a function of a disturbance of the intelligent power semiconductor upon receiving a diagnostic signal fed through the input terminal.

In accordance with a further object of the invention, provision is made of a circuit configuration having an integrated semiconductor element that has a power stage for switching a load, a current source, and a current sink, which are connected to a single diagnostic output and which provide a current at the diagnostic output. The circuit configuration includes a drive circuit for controlling the power stage and/or the current source and current sink. The drive circuit has a display element with a first terminal that is electrically connected to the diagnostic output of the semiconductor element. The diagnostic output of the semiconductor element has a second terminal that is electrically connected to the load output of the power stage and that contains light-emitting semiconductor diodes. The light-emitting semiconductor diodes are connected in antiparallel and output to their environment visual information items, which can be distinguished in accordance with the current fed to them.

Depending on the type of the multiplicity of information desired, either one or more current sources and/or current sinks are integrated in the semiconductor element. The display elements, which can be LEDs, for example, can be fed directly electrically by the use of current sources or current sinks.

In accordance with the invention, the electric connection to the display element is made via precisely one line. The diagnostic function can be achieved without the need for additional electric components to connect the display element.

If the semiconductor element being used is a semiconductor element with an integrated logic circuit and/or with a drive circuit, it is expedient for the current source or current sink and/or the power stage to be driven by the logic circuit.

In an advantageous development, the intensity and flow direction of the current supplied at the diagnostic output by the current source and current sink provide an item of information on the status of the power stage, the load connected to the power stage, or the semiconductor element. The current source connects to the current sink for this purpose in a fashion capable of electric conduction to at least one diagnostic output of the semiconductor element. The diagnostic output serves to signal an item of information on the status of the circuit configuration and/or of a load connected to the semiconductor element. The following can be provided, for example, as items of status information:

1. The semiconductor element and the power stage are operating in normal mode.
2. The semiconductor element and the power stage are switched off.
3. The semiconductor element and the power stage and/or the load connected thereto exhibit a fault, a disturbance, a malfunction or a functional failure. Of course, still further items of status information could also be conceivable.

In a refinement, which is typical in terms of circuitry, the current source and the current sink form a half-bridge configuration relative to one another. The center tap of the half bridge connects to the diagnostic output. The current source and/or current sink are/is preferably constructed as MOSFETs.

Typically, in addition to the diagnostic output, the semiconductor element also has an input terminal, an output terminal connected to the load, and at least one supply terminal for a supply potential. Typically, in addition to the terminals for the diagnosis, the input and the output, the diagnostic element has at least one terminal for a supply potential. Typically, in addition to the terminals for the diagnosis, the input and the output, the diagnostic element has at least one terminal for a supply potential.

At least one of the abovementioned current sources or current sinks preferably connects to the input terminal of the semiconductor element in such a manner that the connection is immediately capable of electric conduction.

In a very advantageous refinement, the power stage embodies a low-side switch. The semiconductor element then has only a single supply terminal at which a first supply potential is present. A second supply potential is impressed here via the output terminal, which connects to the load. It is possible in this way to dispense with one terminal of the semiconductor element.

In accordance with a further preferred embodiment of the invention, the semiconductor element is connected to a load whose first terminal is connected to a negative supply potential. The load path of the semiconductor element is disposed between a positive supply potential and the load output. Such configurations are also known as high-side switches.

The power stage is preferably a power semiconductor component. The power semiconductor component is preferably configured as a power MOSFET or as an IGBT since these components are particularly well suited for switching high currents and/or voltages.

The invention also relates to an integrated display element for diagnosing and displaying a disturbance in a semiconductor element. In diagnosing and displaying a disturbance, the display element has light-emitting semiconductor diodes which are connected in antiparallel, an input terminal, and at least one supply terminal for a supply potential. In accordance therewith, a diagnostic signal is fed via the input terminal. Then, the semiconductor diodes output light signals of different intensity and/or color to their environment as a function of a disturbance of the semiconductor element.

The display element preferably emits light of different wavelength spectra, in particular different colors. Preferably, the wavelength spectra emitted are a function of the current flow and of the direction of the current flow in order to distinguish the type of information items to be displayed.

The display element can include, for example, a green and an orange LED. The green LED then shines in normal mode, the orange LED shines in the event of malfunction, and no LED shines in the switched-off mode. A two-color light-emitting diode can also be used in a particularly expedient fashion. Blue, red, or white LEDs would also be conceivable in addition or alternatively.

In a typical development, the display element contains at least one optocoupler. At least one light-emitting semiconductor diode is advantageously also integrated in the optocoupler. It is also possible, and this is particularly expedient in the case of circuits with electrically isolated power section and logic section, for the display elements to be functional constituents of other electronic components such as, preferably, optocouplers. If optocouplers are used, an electrical isolation of the power section from the logic section results easily, as is required, for example, by applications in a switch-mode power supply, a power supply, in a field bus driver, etc.

Other features which are considered as characteristic for the invention are set forth in the appended claims.

Although the invention is illustrated and described herein as embodied in circuit configuration and display element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a partial schematic and partial diagrammatic view showing a second exemplary embodiment of a semiconductor element according to the invention with a diagnostic element (low-side switch).

DESCRIPTION OF THE PREFERRED EMBODIMENTS

Figure 1:
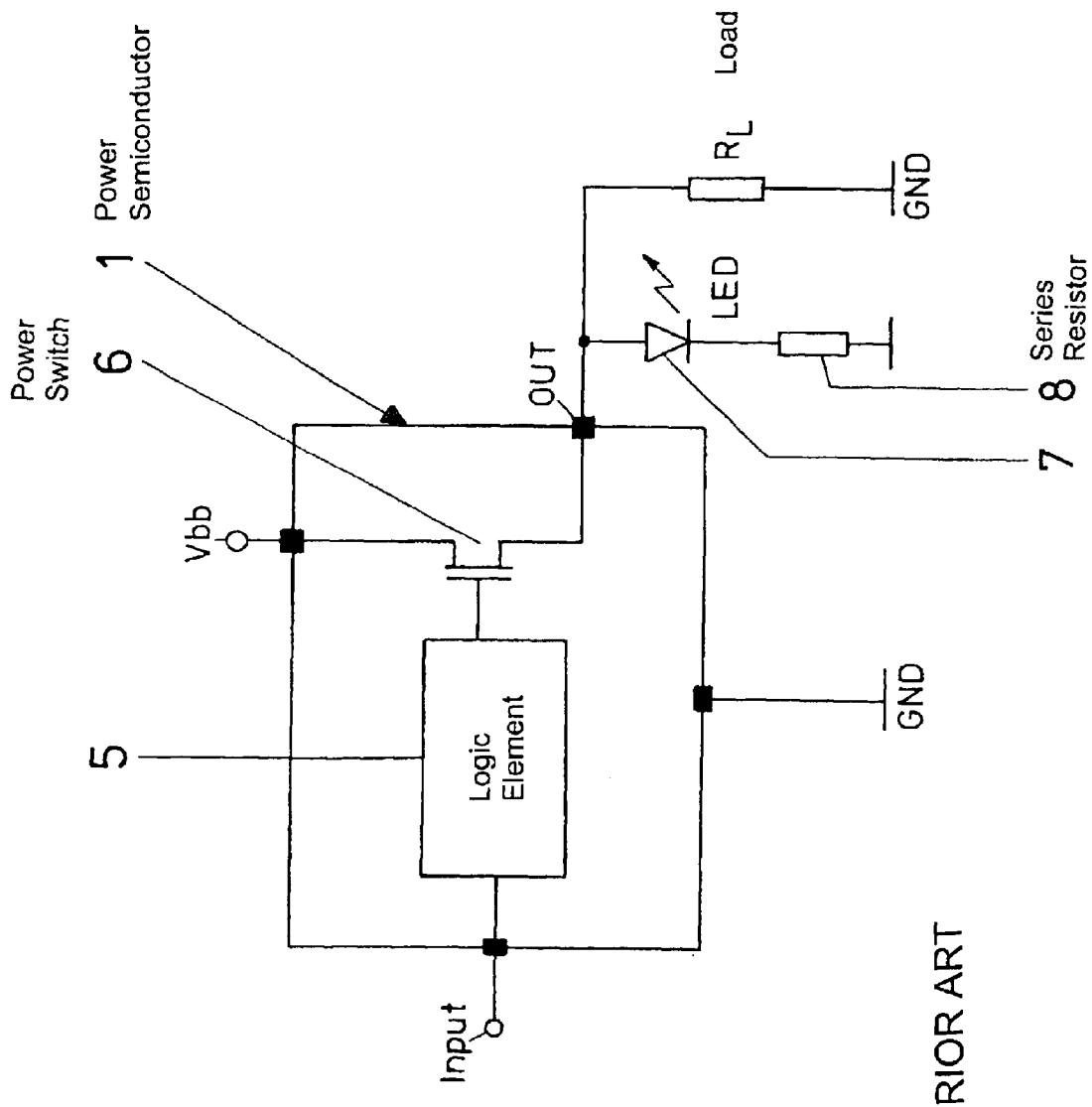
FIG. 1 is a partial schematic and partial diagrammatic view showing a circuit configuration and a semiconductor element with a diagnostic device according to the prior art.

In all the figures of the drawing, sub-features and integral parts that correspond to one another bear the same reference symbol in each case.

Referring now to the figures of the drawings in detail and first, particularly to FIG. 1 thereof, there is shown a circuit configuration in which an integrated intelligent power semiconductor 1 (Smart Power Switch) is connected to a display element 7 for the diagnosis. The power semiconductor 1 includes a logic element 5 and a power switch 6 (for example a MOSFET) connected to the logic element 5. The power semiconductor 1 also has terminals for a supply potential Vbb, for the output OUT, and for a reference potential GND. The output OUT is connected to a load $R_L$. Connected in parallel with the load $R_L$ is a display element 7, which must in general be matched with a series resistor 8.

During operation of the circuit configuration according to the prior art, the display element 7 signals the circuit state of the power semiconductor 1. The display element shines if the power switch 6 is in the switched-on state. The display element does not shine in the converse case, when the circuit breaker is in the switched-off state. A malfunction of the power semiconductor 1 cannot be signaled in the case of the circuit configuration according to FIG. 1.

Figure 2:
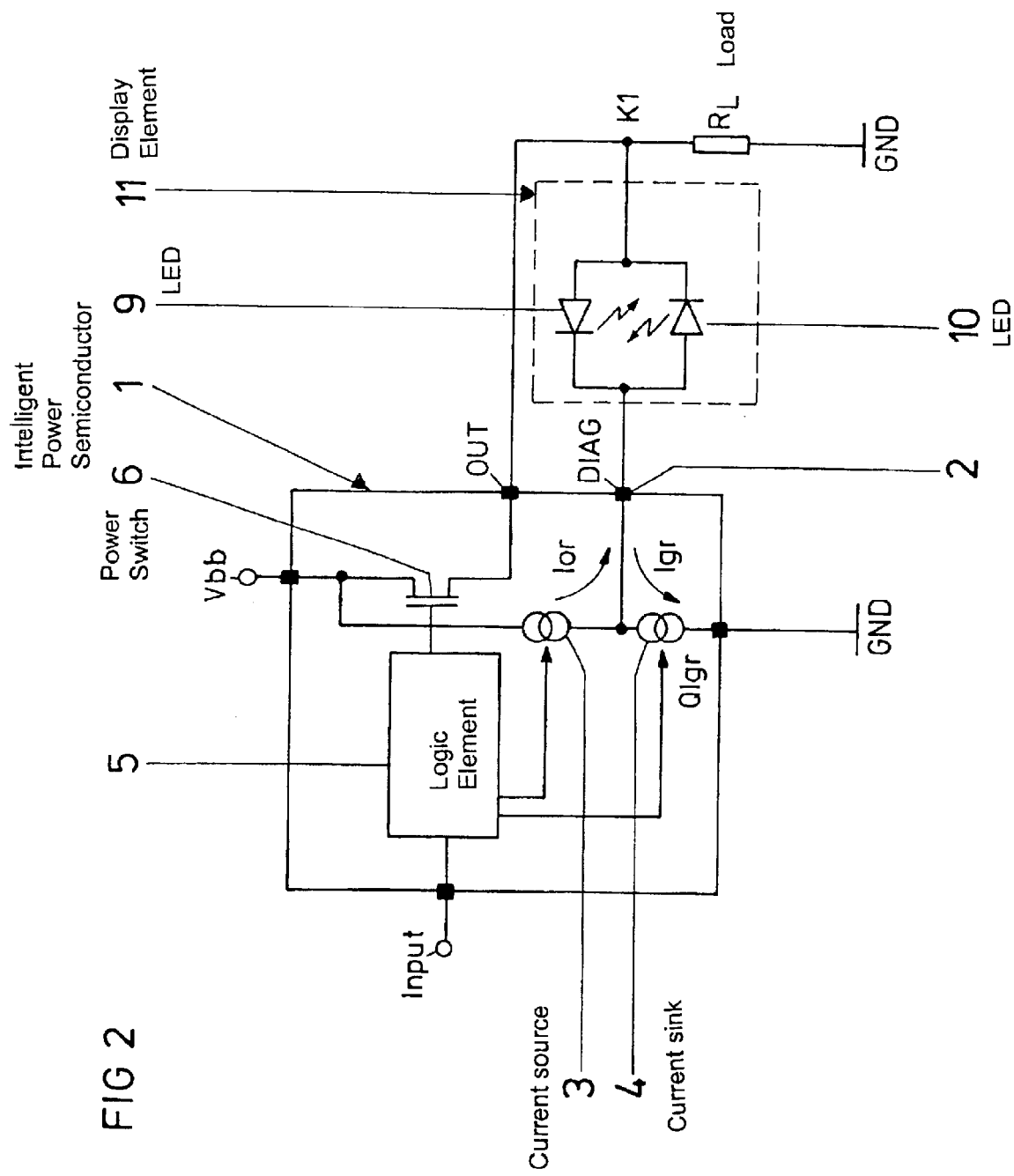
FIG. 2 is a partial schematic and partial diagrammatic view showing a first exemplary embodiment of a semiconductor element according to the invention with a diagnostic device and a diagnostic element connected thereto (high-side switch)

The circuit configuration in FIG. 2 shows an example in accordance with the invention, having an intelligent power semiconductor 1 and a display element 11 connected to the power semiconductor 1. The power semiconductor 1 includes a logic element 5 and a MOSFET 6 connected to the logic element 5. Also provided are terminals for a supply potential Vbb, for the output OUT, and for a reference potential GND. Connected to output OUT is the load $R_L$, a node K1 being provided in accordance with the invention for the terminal of a display element 11. According to the invention, the display element 11 is directly connected to an additionally provided diagnostic output DIAG of the semiconductor element, thus yielding a full H-bridge. The diagnostic output DIAG 2 is supplied by a current source 3 and a current sink 4 such that the display element 11 no longer requires a series resistor. The current source 3 and the current sink 4 connected as a half bridge are driven by the logic element 5. The first terminal of the current source 3 is connected to the supply potential Vbb. The second terminal of the current source 3 leads to the diagnostic output DIAG 2 and to the first terminal of the current sink 4. The second terminal of the current sink 4 is connected to the frame terminal GND.

The display element 11 includes two LEDs connected in antiparallel: a green shining LED 9 and an orange shining LED 10. The display element 11 has two terminals with the aid of which the functions of the display element 11 can be activated. The first terminal is connected to the diagnostic output DIAG 2. The second terminal is connected to node point K1.

During operation of the circuit configuration, the display element 11 switches the provided signal states as a function of the direction of the current flowing through the display element 11. When no current flows, both LEDs 9, 10 remain off. If the current source 3 is activated, for example, upon the occurrence of a short circuit, a current Ior flows from terminal DIAG 2 to the node K1. The display element 11 or the LED 10 shines orange. If the current Igr flows in the reverse direction in the case of an activated current sink 4, the display element 11 or the LED 9 shines green. Normal operation, for example, can be displayed thereby. The circuit states are determined by the logic element 5, and so in addition to the status of the load $R_L$ it is also possible to signal a malfunctioning of the power semiconductor 1. In the case of a short circuit, the node Ki is drawn to a low potential, and the current for the orange light-emitting diode 10 can flow via current source 3 from the positive supply potential Vbb via the light-emitting diode to terminal GND. The circuit configuration in accordance with FIG. 2, is therefore configured as a high-side switch.

FIG. 3 shows a further example according to the invention for a circuit configuration and for a possible embodiment of an intelligent power semiconductor 1 according to the invention. The display element 11 corresponds to the embodiment illustrated in FIG. 2. The power semiconductor 1 with logic element 5 drives a power switch 6, which is, for example, a MOSFET. Via the input Input, the logic element of the intelligent power semiconductor receives from the outside drive signals for the desired circuit state of the power switch 6.

A terminal for the supply potential Vbb can be eliminated in accordance with the embodiment of FIG. 3. For this purpose, output OUT is connected via node point K1 to the side of the load $R_L$ with reduced output potential. The load $R_L$ is connected directly to the positive supply potential Vbb. A further connection to the second terminal of the display element 11 exists from the node point K1. The first terminal of the display element 11 is connected to the diagnostic output DIAG 2 of the semiconductor element. The diagnostic output DIAG 2 is supplied, as in FIG. 3, by a current source 3 and current sink 4. The current source 3 and the current sink 4 are likewise driven by the logic element 5, as in FIG. 3. The first terminal of the current source 3 is directly connected to the input Input. The second terminal of the current source 3 leads to the diagnostic output DIAG 2 and to the first terminal of the current sink 4. The second terminal of the current sink 4 is connected to the terminal GND.

The circuit configuration of FIG. 3 is configured as a low-side switch, and this advantageously leads to a saving of a voltage supply terminal Vbb.

The present semiconductor element according to the invention (having a diagnostic device, the diagnostic element, and the circuit configuration for diagnosing) have been set forth with the aid of the preceding description so as best to explain the principle of the invention and its practical application. of course, the configuration according to the invention can be modified multifariously within the scope of activity of the person skilled in the art.

I claim:

1. A circuit configuration, comprising:
    an integrated power semiconductor element having a single diagnostic output, a logic element, a power switch for switching a load and having a load output, a current source, and a current sink; the load connected to said load output, the current source and the current sink being connected to said single diagnostic output and providing a current at said diagnostic output; said logic element controlling at least one of said power switch, and the current source and the current sink; and
    a display element having light-emitting semiconductor diodes, a first terminal, and a second terminal; said first terminal electrically connected to said single diagnostic output of said integrated power semiconductor element; said second terminal electrically connected to said load output of said power switch; and said light-emitting semiconductor diodes being connected in antiparallel between said first terminal and said second terminal and outputting different visual information items when receiving different currents.

2. The circuit configuration according to claim 1, wherein the current source and the current sink provide a current at said single diagnostic output having an intensity and flow direction, the intensity and flow direction providing an item of information regarding a status of said power switch.

3. The circuit configuration according to claim 2, wherein said power switch connects to the load.

4. The circuit configuration according to claim 2, wherein said integrated power semiconductor element connects to the load.

5. The circuit configuration according to claim 1, wherein the current source and current sink are disposed in a half-bridge configuration relative to one another having a center tap, and the center tap is connected to said single diagnostic output.

6. The circuit configuration according to claim 1, wherein the current source is a MOSFET.

7. The circuit configuration according to claim 1, wherein the current sink is a MOSFET.

8. The circuit configuration according to claim 1, wherein the current source and the current sink are MOSFETs.

9. The circuit configuration according to claim 1, wherein said integrated power semiconductor element further includes an input terminal, an output terminal connected to the load, and a supply terminal for receiving a supply potential.

10. The circuit configuration according to claim 9, wherein said integrated power semiconductor element is a low-side switch having a single supply terminal, at which a first supply potential is present, and outputting a second supply potential at said output terminal.

11. The circuit configuration according to claim 10, wherein at least one of the current source and the current sink is connected directly and electrically to said input terminal.

12. The circuit according to claim 1, wherein said power switch is a power semiconductor component.

13. The circuit according to claim 12, wherein said power semiconductor component is a power MOSFET.

* * * * *